(12) United States Patent  (10) Patent No.: US 6,310,392 B1
Burns  (45) Date of Patent: Oct. 30, 2001

(54) STACKED MICRO BALL GRID ARRAY PACKAGES

(75) Inventor: Carmen D. Burns, Austin, TX (US)

(73) Assignee: Staktek Group, L.P., Austin, TX (US)

( * ) Notice: Subject to any disclaimer, the term of this patent is extended or adjusted under 35 U.S.C. 154(b) by 0 days.

(21) Appl. No.: 09/221,350

(22) Filed: Dec. 28, 1998

(51) Int. Cl.⁷ .................................................. H01L 23/34
(52) U.S. Cl. ............................................ 257/723; 257/701
(58) Field of Search .................................. 257/723, 701, 257/700

(56) References Cited

U.S. PATENT DOCUMENTS

| | | | |
|---|---|---|---|
| 3,983,547 | * | 9/1976 | Almasi ................................. 340/174 |
| 5,198,965 | * | 3/1993 | Curtis et al. ......................... 361/386 |
| 5,776,797 | * | 7/1998 | Nicewarner, Jr. et al. .......... 438/107 |

* cited by examiner

Primary Examiner—Roy Potter
(74) Attorney, Agent, or Firm—J. Scott Denko; George & Donaldson, L.L.P.

(57) ABSTRACT

Integrated circuit modules made in accordance with the methods of the present invention have multiple Ball-Grid Array (BGA) packages mounted to a substantially planar support substrate. Each package is inclined at an angle to the support substrate and partially overlaps another package. The first package or row of packages overlaps a wedge that is provided for support. A flexible substrate is mounted to each BGA package and has a portion that extends away from the package to adhere to the support substrate, for communication between each package and signal lines on the support substrate. Optionally, a portion of the substrate that extends away from the integrated circuit package can be bent back at a 180° angle to allow the pads on the top surface of the flexible substrate to attach to mating pads on the support substrate. Precise control of the impedance of select signal traces is accomplished through the use of ground traces that run parallel with the select signal, a ground plane layer, and alternating signal-substrate mounting pads with GND-substrate mounting pads. One aspect of the present invention has the package leads located in close proximity to one side of the package for optimally short trace lengths. Another aspect provides a method for routing signals for optimal signal length and elimination of stubs. A preferred embodiment of a flexible substrate has an accordion portion formed in the flexible substrate to provide elasticity for preventing stretching and distortions of the flexible substrate during automated assembly. A method is provided for connecting signals lines of each flexible substrate in series. Various embodiments of package lead mounting pads formed in the flexible substrate that provide electrical and thermal coupling to package leads including ring-shaped pads, flexible tabs, and apertures for removing flux, excess solder, and debris.

17 Claims, 9 Drawing Sheets

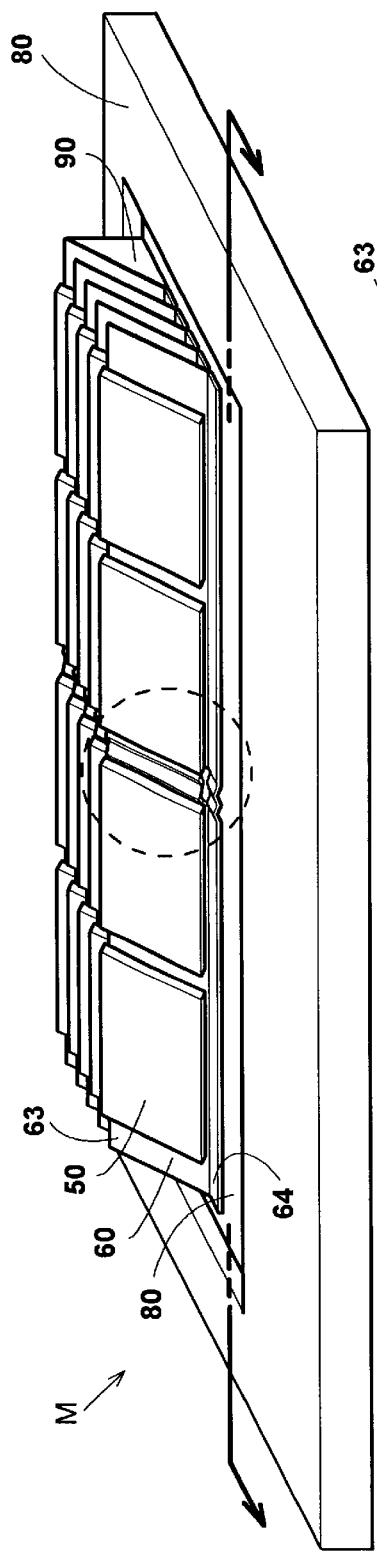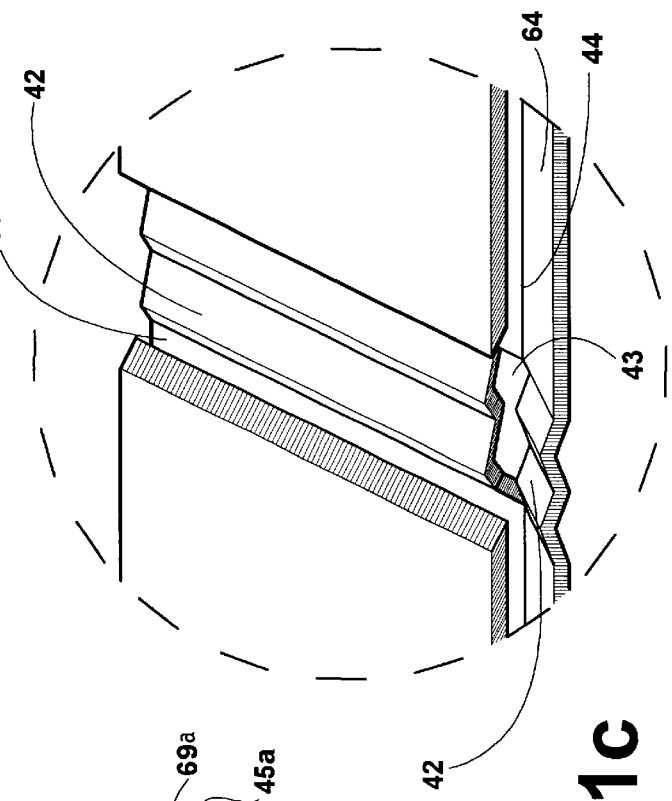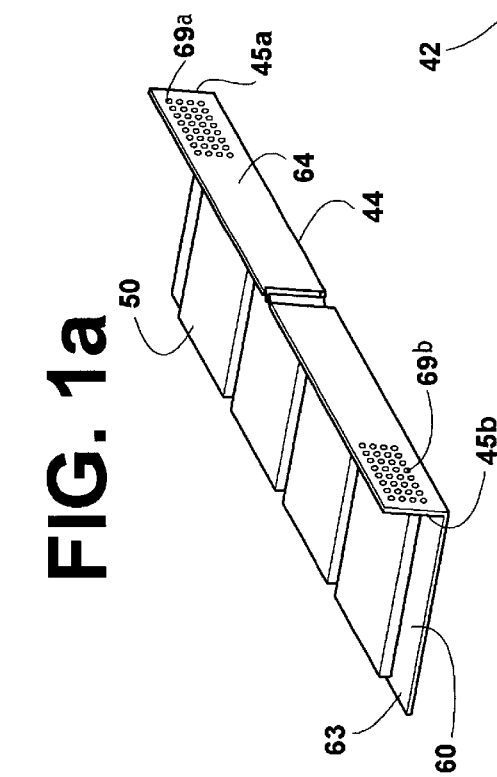

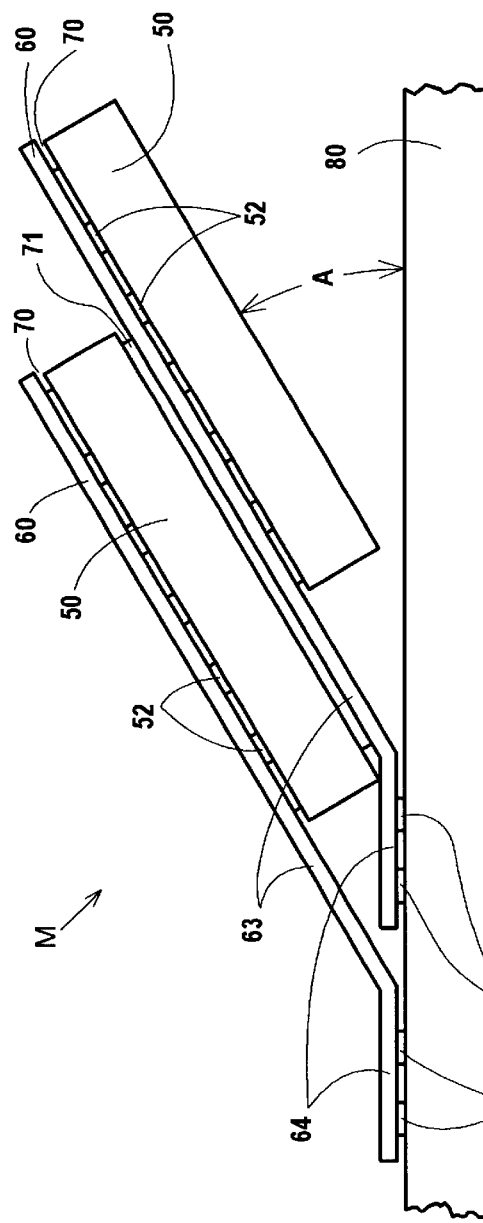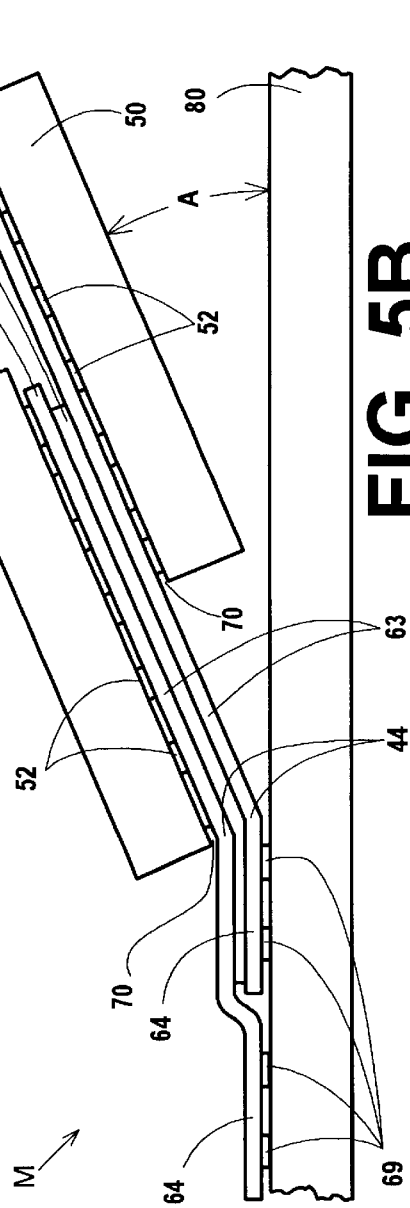

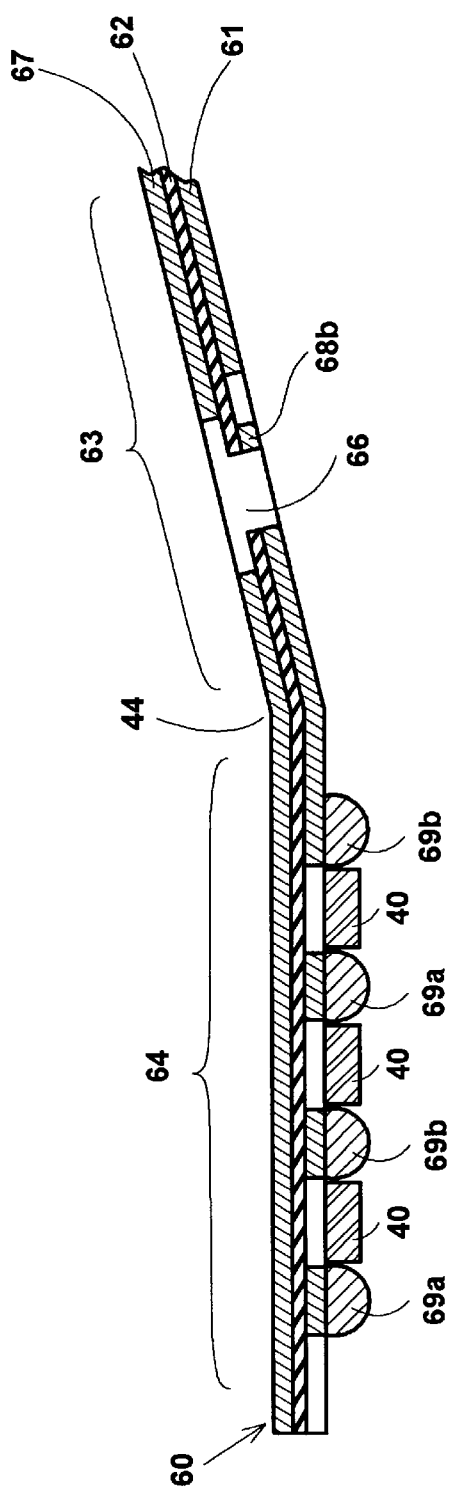
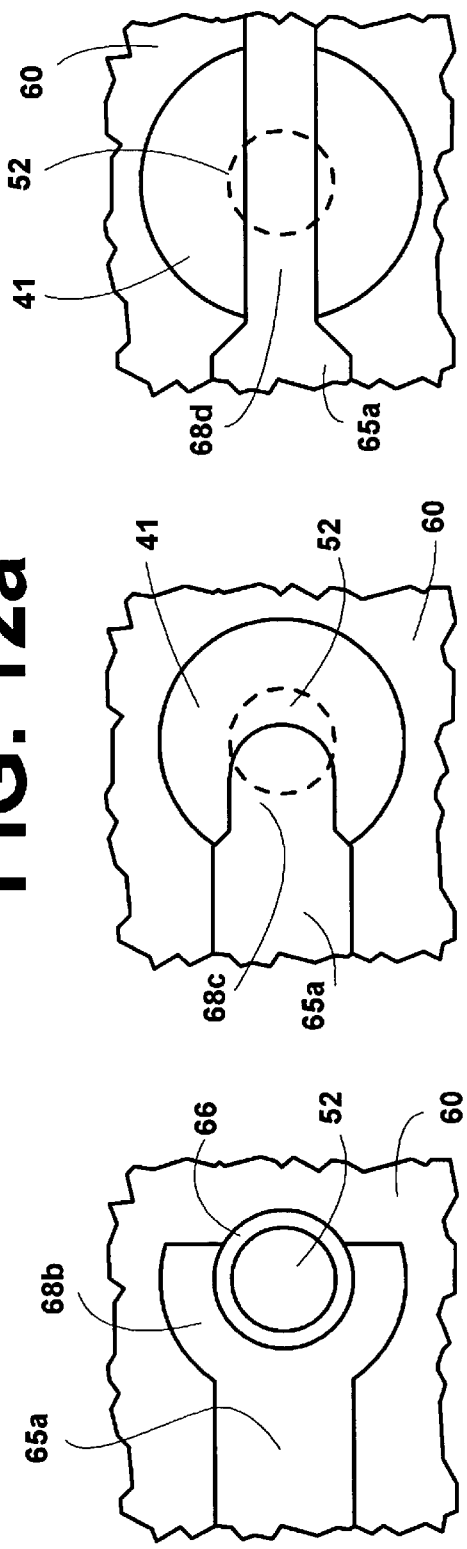
FIG. 12a
FIG. 12b
FIG. 12c
FIG. 12d

STACKED MICRO BALL GRID ARRAY PACKAGES

BACKGROUND OF THE INVENTION

This invention relates to multi-package integrated circuit modules. In particular, this invention relates to Dual In-line Memory Modules (DIMM), comprised of Ball-Grid-Array (BGA) or other near chips scale or chip scale packages, that have increased density, enhanced reliability, and precision impedance control for high speed memory applications. The DIMM module physical size and the system interface conform to one of two specifications for 168 pin, 8-byte wide DIMMs; the first generation buffered DRAM DIMM, and the second generation unbuffered DRAM DIMM DIMMs based on RAMBUS™ technology are capable of data transfer rates up to 800 Mhz using low voltage swings of 800 mv. Data is transferred across a 16-bit bus on both edges of a 400 Mhz-clock signal. The high-speed operation of a RAMBUS CHANNEL™ requires dense packaging and high quality transmission lines. The RAMBUS CHANNEL™ high-speed signals require matched transmission lines that have the identical propagation characteristics and travel across a uniform, parallel layout. These high-speed signals require a uniform matched impedance of 25 to 65 ohms over the entire length of each signal-transmission line after all components are installed. Multiple DRAM components that are electrically coupled to a single data transmission line present periodically spaced capacitive loads, which significantly effect the impedance of a portion of the transmission line. The periodic spacing between these capacitive loads on the transmission line is referred to as pitch. Decreasing the pitch has the effect of decreasing the impedance of the transmission line as a whole. Other parameters which effect the impedance of a signal transmission line are the properties and thickness of the material located between the line and either an adjacent ground plane, ground line, or signal line. Increasing the dielectric thickness or decreasing the signal line width has the effect of increasing the impedance of the effected portion of the transmission line. RAMBUS™ layout guidelines require the high-speed channel signals to be routed on a single signal layer with no vias, and with data signals routed in parallel with clock signals. Vias typically have a physical shape that creates a capacitance effect in the order of 1 pF; for this reason, the RAMBUS CHANNEL™ guidelines state that vias are not allowed on high-speed transmission lines. These guidelines allow for 20% variation in dielectric thickness, signal line trace widths, and copper thickness. Signal line trace length among the 13 high-speed signals can vary by 100 mils (2.5 mm). Deviations from the guidelines that maintain the desired transmission line characteristics are acceptable.

Ball-Grid-Array (BGA) Integrated circuit packages typically have leads that extend from the bottom surface of a rectangular solid casing in a two-dimensional grid pattern. Package leads provide electrical and thermal coupling to one or more integrated circuit dies that are embedded within the protective casing. The external portion of each lead has a relatively large ball of solder. Typically, the protective casing completely surrounds the embedded die, but in some BGA packages, the protective casing does not cover the inactive top surface of the die. Near-chip scale packages provide 1.0 mm center-to-center lead spacing. Chip-scale packaging, having 0.5 mm center-to-center lead spacing, offers excellent electrical characteristics including low capacitance and thermal design.

Prior methods of manufacturing memory modules unnecessarily limit the number of integrated packages that can be placed on a standard DIMM module while maintaining electrical characteristics required for the high-speed transmission-lines of RAMBUS CHANNEL™.

Known methods for manufacturing multi-package modules, typically have signal transmission lines with inconsistent impedance in portions as well as structures and multiple-dissimilar materials comprising a single transmission line that can cause reflections of propagating high-speed signal transitions, such as the data transfers that occur each 1.25 nanosecond period on a RAMBUS CHANNEL™. These reflections compromise the integrity of the system by increasing the settling time of the signal. This settling time is commonly referred to as ringing. Ringing is high frequency signal oscillation, typically in the 100 MHZ to 1 GHz range, that can occur when signals quickly transition from one voltage level to another as a result of reflections. This ringing can create cross talk. Crosstalk is undesired noise added to a signal resulting from a magnetic field radiated from adjacent signals. Ringing also increases the overall electromagnetic radiation from the system. When ringing couples over as noise to power input signals or increases ground bounce it will slow the response from the high-speed devices such as memory. More precise control of the impedance of the transmission lines is necessary to reduce ringing.

SUMMARY OF THE INVENTION

The methods and apparatus of the present invention enable the economical manufacture of multi-package modules comprised of chip-scale packages, and provide enhanced thermal characteristics, while maintaining high-quality transmission lines required for RAMBUS CHANNEL™. Integrated circuit modules, made in accordance with the methods of the present invention, include multiple chip scale packages mounted to a support substrate. Each package is inclined at an angle to the support substrate and partially overlaps another package. The first package or row of packages may be supported by a wedge structure on the support substrate to establish the angle of inclination of the packages. A flexible substrate or flex circuit is mounted to the bottom surface of each package and has a portion that extends away from the mounted integrated circuit packages to adhere to the support substrate. It will be apparent to those skilled in the art of integrated package manufacturing that the methods and apparatus described herein are applicable to a broad range of modules comprised of multiple integrated circuit packages.

One embodiment of the present invention has chip scale packages mounted to the upper surface of a flexible substrate. Package lead pads formed in the flexible substrate electrically couple to select package leads. A portion of each flexible substrate extends away from the integrated packages and includes circuit interconnect pads located on the lower surface for electrical and thermal coupling to corresponding interconnect pads on the support substrate. Another embodiment of a flexible substrate of the present invention, has the extended portion folded back, at a 180° angle to itself, allowing circuit interconnect pads on the upper surface of the flexible substrate to couple with corresponding interconnect pads on the support substrate.

An alternative embodiment provides two chip scale packages mounted to opposite sides of two adjacent flexible substrates, each of which is coupled to a different one of the package's leads. The extended portion of each flexible substrate attaches to the support substrate.

Different specific aspects of the present invention can be used singularly or in combination with other methods of the present invention for precision control of the impedance in each portion of select transmission signal lines formed in the flexible substrate. One method utilizes one or more electrical ground (GND) traces that are located in close proximity and parallel to a substantial portion of the signal trace. Another method has a ground (GND) plane layer separated from the signal layer by a dielectric layer. One method arranges interconnect pads, which couple signal lines on the flexible substrate to signal lines on the support substrate, such that interconnect pads that are to carry high speed signals are located adjacent to interconnect pads that are designated to be coupled to GND.

Different preferred embodiments are described herein for the package lead mounting pads, or receptacles, formed in the flexible substrate, for coupling select package leads to select signal lines formed in the flexible substrate. One embodiment of the present invention provides apertures or receptacles in the flexible substrate that are adapted to receive package leads. A ring-shaped pad, formed in the flexible substrate, surrounds a substantial portion of each aperture. The application of heat causes the solder on the distal end of the package leads to flow, electrically and thermally coupling each lead to a ring-shaped pad. Alternately, a flexible tab formed so as to extend into each aperture may be provided for coupling to the package leads. Each flexible tab is formed with a package lead mounting pad for connection to a package lead.

In the preferred embodiment, a layer of thermally conductive adhesives having a thickness approximately equal to the nominal length of a package lead is provided on the lower surface of the package. Select void areas in the adhesive allow package leads to extend through the layer and firmly mate with the package lead mounting pads. In all embodiments, it is preferred to use what is known in the industry as a no-clean solder paste, such as Alpha Metals Ultraprint 78, which eliminates the need for post-solder cleaning in the area of the lead to pad coupling. If conventional solder is used, it is preferred to provide an aperture around the flexible tab or ring pad that is wide enough to allow removal of flux, debris, and excessive solder by rinsing or similar procedure. Alternately, the aperture can have a package mounting pad extending from one side of the aperture to the other leaving two void areas on either side for the vacuum suction of flux, debris, and excessive solder.

One aspect of the present invention for minimizing the length of signal lines utilizes ball-grid-array packages where the package leads are located in close proximity to one side of the package. The package is mounted to a flexible substrate or flex circuit with the package leads in close proximity to the extended portion of the flexible substrate.

Another aspect of the present invention provides for a section of the support substrate to be formed substantially thinner than the remainder to decrease the overall height of the module. Yet another aspect of the present invention provides an accordion-like portion formed in the flexible substrate for increased elasticity to facilitate registration of the flexible substrate with the support substrate without imposing stress due to stretching or distortion during automated assembly.

The present invention provides a method for the optimal routing of signals through the support substrate to each flexible substrate. Each flexible substrate includes two groups of interconnect pads for connecting to a corresponding set of interconnect pads on the support substrate. Signal lines enter each flexible substrate through a first group of pads, route through conductive traces to select package leads, and exit through the a second group of pads. Signals lines in each flexible substrate are connected to the corresponding signal lines in other substrates through conductive traces formed in the support substrate. Typically, each signal line is connected, in series, with a signal line in one of the other flexible substrates, to form a single signal transmission line, having one starting point, one end point and no stubs. Preferably, the two groups of pads are located near opposing ends of the extended portion of each substrate and traces on the support substrate electrically connect groups of pads on adjacent flexible substrates that are on the same end.

The present invention provides inclined packages which allows for increased variability in the height of a package. The methods and apparatus of the present invention provide a variety of techniques for precise impedance control of every portion of select signal transmission lines that may be tailored for a range of specific applications. Prior methods did not provide for optimal short signal transmission lines and typically required structures and multiple interconnections of dissimilar materials that create reflections in high-speed signal transitions. The improvement in impedance control provided by the present invention significantly improves the operational reliability of the system.

Other methods for providing high density stacked modules are disclosed in U.S. Pat. Nos. 5,279,029, 5,367,766, and 5,455,740, 5,480,959, and 5,592,364, all of which are assigned to the common assignee of the present invention and all incorporated herein by reference.

BRIEF DESCRIPTION OF THE DRAWINGS

FIG. 1a is a three-dimensional view of one embodiment of the multi-package module of the present invention;

FIG. 1b is a three-dimensional view of an embodiment of a single flexible substrate carrying a row of packages for use in the module of the present invention;

FIG. 1c is an exploded view of a detail from FIG. 1a, which illustrates an enlarged view of an accordion portion of a flexible substrate of the present invention;

FIGS. 3 and 4 are side views of alternative embodiments of the module of FIG. 1a;

FIGS. 5a and 5b are partial side views of alternate configurations of a module of the present invention;

FIG. 12a is an alternative cross-section along line A—A of the flexible substrate of FIG. 6 illustrating an embodiment of a flexible substrate and other aspects of the present invention;

FIGS. 12b–12d are planar views of portions of a flexible substrate of the present invention illustrating alternative package lead mounting pad configurations.

DETAILED DESCRIPTION OF THE PREFERRED EMBODIMENTS

Figure 2A:
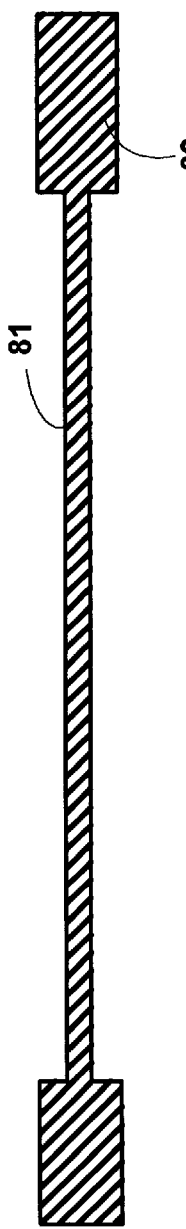
FIG. 2a is a cross-section of one embodiment of the support substrate of FIG. 1a where a portion of the substrate is thinner in the middle than at the edges.

In the description that follows, numeric reference characters followed by a character from the alphabet reference elements that are a specific embodiment or subset of the element referenced by the numeric character alone. For example, element 65a is a subset of element 65 and has all the properties and attributes of element 65.

Referring now to the drawings, FIG. 1a illustrates a preferred method for mounting multiple chip scale or BGA packages 50 to a support substrate 80 to form a module M. The embodiment illustrated includes five flexible substrate 60 mounted to a single support substrate 80. It should be noted, however, that the methods and apparatus of the present invention are not limited to any particular number of packages, or flexible substrates which could be mounted to a specific support substrate.

Again with reference to FIG. 1a, a first portion 63 of each flexible substrate 60 provides mounting for four chip scale or ball-grid-array packages 50 aligned side-by-side to form a single row. Alternately, in accordance with the methods of the present invention, each flexible substrate 60 may have more than one row of packages 50 or merely a single package 50. FIG. 1b shows an alternate view of one of the flexible substrates 60, shown in FIG 1a, with four mounted packages 50. As can be seen in FIG. 1b, a second portion 64 of each flexible substrate 60 extends away from the packages 50, and includes interconnect pads 69 for electrical and thermal coupling with corresponding interconnect pads 82 located on the support substrate 80, as shown in FIG. 2b.

Figure 3:
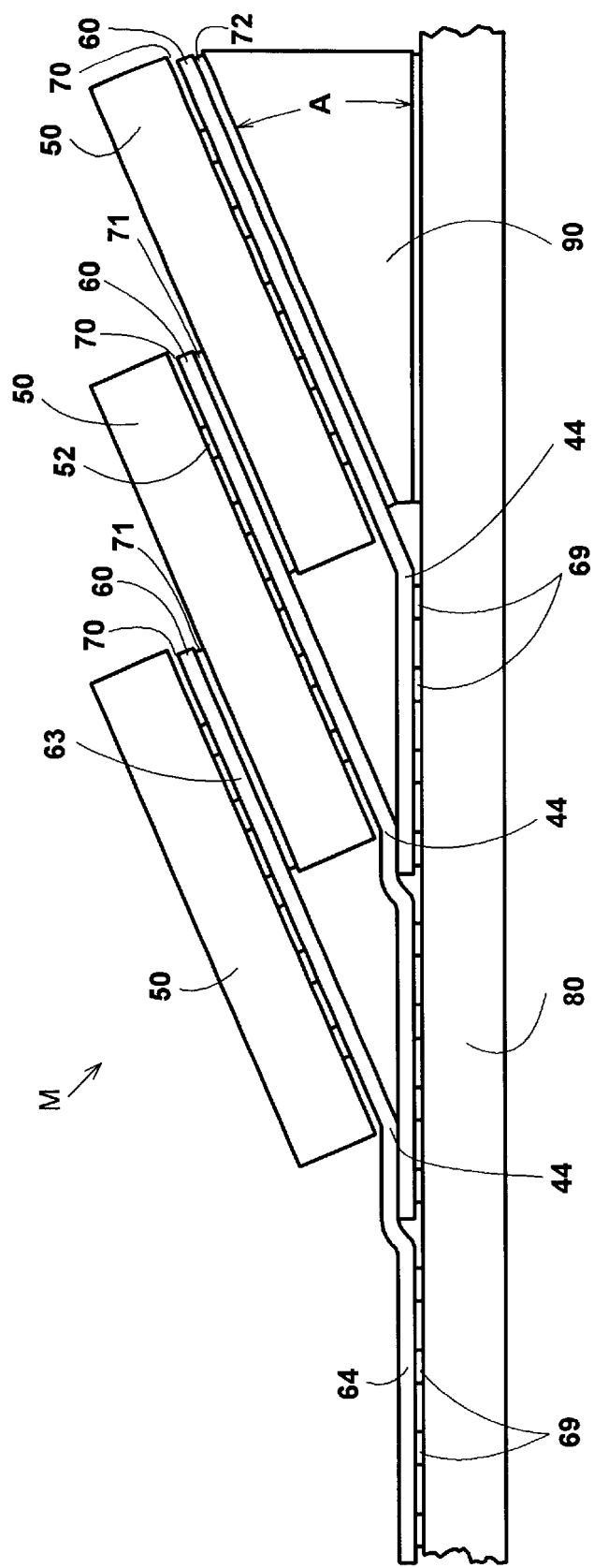

Referring now to FIG. 3, flexible substrates 60 with mounted packages 50 are mounted on the support substrate 80 so that packages 50 are inclined at an angle A with respect to the mounting surface of the support substrate 80. To define the angle A, the first row of packages 50 are supported by a wedge 90, which may be adhered to or otherwise formed with the support substrate 80. The angle of inclination of each subsequently mounted row of packages 50 is established by mounting subsequent rows to overlap a portion of the previously mounted row of packages 50.

Throughout this specification where adhesives are referred, such as adhesive 70, 71, 72 and 73 shown in FIGS. 3–13, for mounting packages 50 and substrates 60, 80, such adhesives are preferably electrically insulating with enhanced thermal conductivity equal to or greater than the thermal conductivity of the outer portions of the package 50 for facilitating direct heat exchange. Adhesive layers 70, 71, 72 and 73 may be, for example, an epoxy, such as Rogers Corp. R/flex 8970 which is B-staged phenolic butyryl epoxy that may be laminated at a temperature of 130 degrees centigrade and cured at a temperature of 175 degrees centigrade. Alternately, the adhesive layers 70, 71, 72 and 73 may be a 2 mil thick sandwich of polyamide film, such as Kapton™ which includes a 0.5 mil thick layer of adhesive on both sides (a three-layer system).

Figure 7:
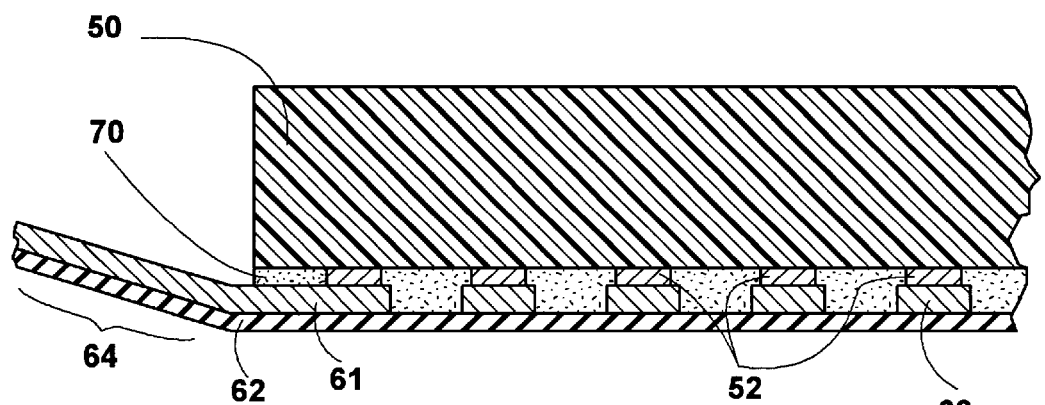
FIG. 7 is a cross-section along line A—A of FIG. 6 for illustrating an aspect of the present invention.
Figure 8:
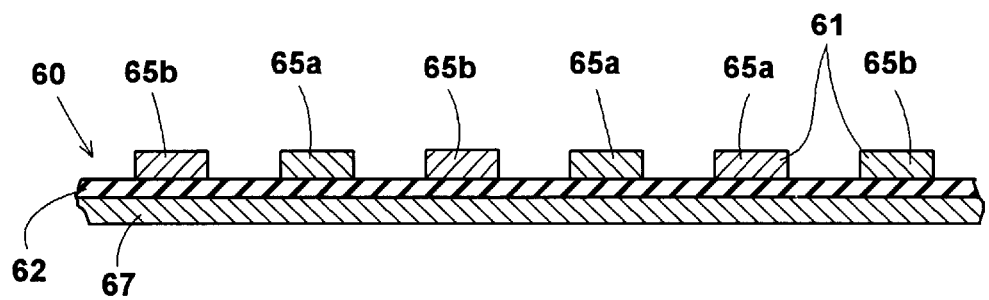
FIG. 8 is a cross-section along line B—B of FIG. 6 for illustrating an aspect of the present invention.

In the preferred embodiment, flexible substrate 60 is formed from a commercially available material commonly known as flexible circuit boards or flexcircuits. Such flexcircuits are typically built to custom specifications to relatively close material and physical layout tolerances to provide consistent and accurate electrical characteristics such as impedance. As shown in FIGS. 7, 8 and 1b, commercially available flexible substrates 60 are typically comprised of one or more thin layers of conductive material that are die cut to form ground planes 67, signal traces 65, and pads 69 (FIG. 1b) to couple to support substrate 80 and pads 68 to couple to package leads 52 (FIG. 7). The conductive elements such as traces 65 and ground plane 67 typically flank a thin (typically 1 to 11 mils thick) layer of dielectric material 62 such as polyimide which results in thin planar circuit boards 60 that are flexible.

Figure 2B:
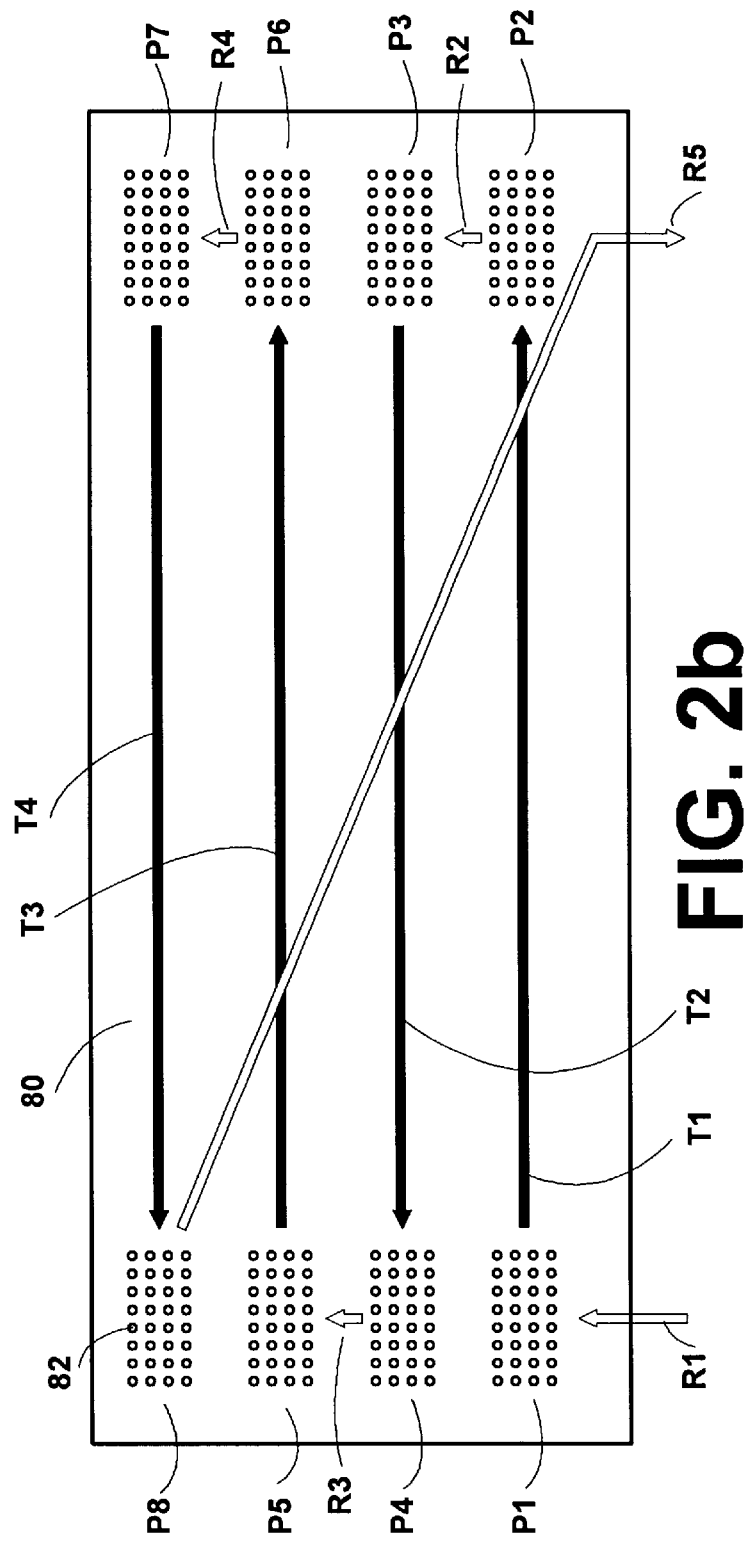
FIG. 2b is a planar view of a support substrate, with reference arrows to illustrate the preferred method for routing signals.

Referring now to FIGS. 2a and 2b, suitable support substrates 80 are made of alternating thin layers of rigid dielectric material such as FR4 and conductive material such as copper (not illustrated). The support substrate 80 may provide for mounting additional electrical components (not illustrated) on it and may include an edge connector for industry compatible connectivity. The side with the edge connector has a thickness compatible with the standards for DIMM connectors, which is typically 0.050 inches. To reduce module height, the section 81 of the support substrate 80 which underlays the packages 50 may be thinned as much as possible without compromising the rigidity of the resultant module. Such sections 81 of support substrates 80 made from layers of FR4 material and copper may be as thin as 0.015 inches without compromising rigidity.

The combination of a flexible substrate 60 connected to a support substrate 80 provides enhanced reliability. The flexible substrate 60 is tolerant of the expansions and contractions associated with temperature variations and the support substrate 80 provides the mechanical strength tolerance preferably to endure stresses associated with handling and shock.

FIG. 2b shows a planar view of a support substrate 80 and illustrates the preferred method for routing signals through the support substrate 80 to each flexible substrate 60. The second portion 64 of each flexible substrate 60 has two groups of interconnect pads 69a, 69b which are located in close proximity to opposing longitudinal ends 45a, 45b, as shown in FIG. 1b. Signal lines enter each flexible substrate 60 through a first groups of interconnect pads 69a and exit through a second group of pads 69b. Select interconnect pads 69a are each coupled to a select trace within flexible substrate 60 that is routed to select package leads 52 and to a second select interconnect pad 69b. Referring now to FIG. 2b, the support substrate 80 includes eight groups of pads 82 for mounting four flexible substrates 60. Double-line arrows R1–R5 show the direction that signal transmission lines are routed through the support substrate 80 and solid-line arrows T1–T4 show the direction that signal transmission lines are routed through each flexible substrate 60. Signal lines originate from one area of the support substrate 80, as shown by arrow R1, and are routed through the support substrate 80 to a first group P1 of pads 82. Signals are routed though through the first flexible substrate 60 (not illustrated) to a second group P2 of pads 82 as shown by arrow T1. Signals are routed though the support substrate 80 as shown by arrow R2 to the nearest group of pads P3 for entering the next adjacent flexible substrate 60 (not shown). In a similar manner, signals are routed, as shown in FIG. 2b, through each flexible substrate 60 and then exit the support substrate as indicated by arrow R5. In other words, each trace 65, in each flexible substrate 60, that is electrically coupled to one interconnect pad 69a and to one interconnect pad 69b, is electrically coupled in series to a corresponding trace 65 in each of the other flexible substrates 60 to form a single signal transmission line having one origination point on the support substrate 80 and one end point on the support substrate 80. The groups of pads of any two adjacent flexible substrates 60 that are electrically coupled are located near the same end 45a or 45b. This method eliminates signal line stubs that can cause reflections and provides for optimally short signal lines.

Referring now to FIGS. 1b and 2b, the preferred method for mounting a flexible substrate 60 to a support substrate 80 utilizes an automated placement machine. The automated placement machine positions a first group of pads 69a of each flexible substrate 60 to a mating group of pads 82 on the support substrate 80, then positions the second group of pads 69b of each flexible substrate 60 to a second group of pads 82 on the support substrate 80. As shown in FIG. 1c, the flexible substrate preferably includes an expanding portion 42 formed in the flexible substrate 60 to provide longitudinal flexibility to facilitate registration during automated assembly. The expanding portion 42 has one or more folds, as shown in FIG. 1c, that can flatten when the automated placement machine pulls the flexible substrate 60 to position it on the second group of pads 82 on the support substrate 80, and exerts a spring like force in resistance to the pulling action.

Figure 4:
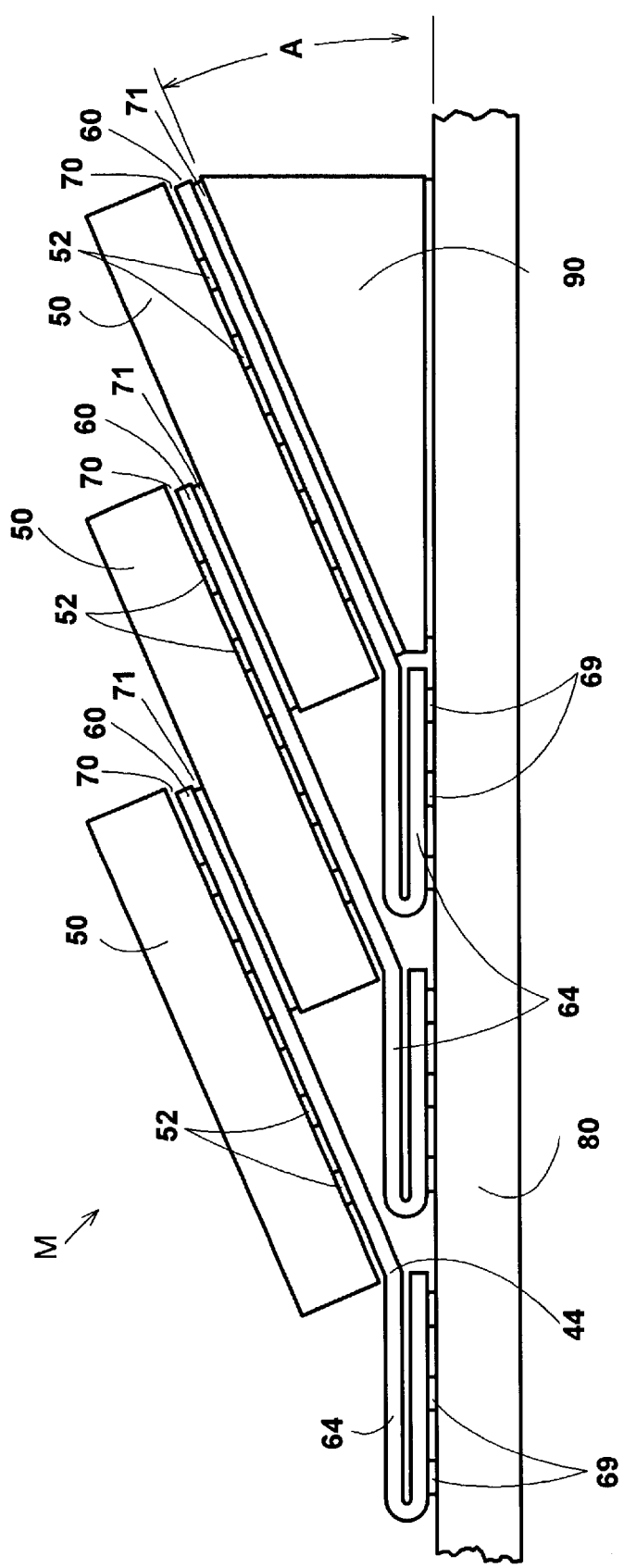

FIGS. 3 and 4 show alternative embodiments of the integrated circuit module shown in FIG. 1. Integrated circuit packages 50 are mounted to the top surface of a flexible substrate 60 with select package leads 52 electrically coupled to select package lead pads 68, as illustrated in detail in FIGS. 7–10. A portion 64 of each flexible substrate 60 extends away from the package 50 to provide electrical and thermal connectivity between the package leads 52 and the support substrate 80. FIG. 3 illustrates one embodiment of the present invention where a portion 64 of the flexible substrate 60 has interconnect pads 69 located on the bottom surface for electrical and thermal coupling to mating interconnect pads 82 on the support substrate 80. Interconnect pads 69 on the flexible substrate 60 preferably are provided with a coating of solder which flows when heat is applied and any suitable means may be used to hold substrate 60 in position over support substrate 80 until registration is achieved. To improve density, the portion 64 of the flexible substrate 60 that mates with the support substrate 80 can overlap a similar portions 64 of other flexible substrates 60 as shown in FIG. 3.

FIG. 4. illustrates an alternative embodiment of the present invention where a portion 64 of the flexible substrate 60 is doubled-back at a 180-degree angle. In this embodiment, interconnect pads 69 are located on the top surface of substrate 60, so that the doubled-back portion provides coupling between pads 69 and interconnect pads 82 on the support substrate. This method has the disadvantage of increasing signal length. However, the signal length is increased equally for all signals as required for the RAMBUS CHANNEL™.

Also as shown in FIGS. 3 and 4, a wedge 90 is formed from plastic or other suitable such as FR4 and is mounted or formed integrally with support substrate 80. The wedge 90 provides mechanical support for the flexible substrate 60 and packages 50 at the desired angle A. The angle A between the major plane of the integrated circuit packages 50 and the top major surface of the support substrate 80 may be as great as 90 degrees. The angle A may also be as small as possible while allowing an edge of one package 50 to overlap the edge of another package 50.

Alternate embodiments of the present invention are shown in FIGS. 5a and 5b. The embodiment illustrated by FIG. 5a offers the advantage of having packages 50 attach to the same surface of the flexible substrate 60 that is also attached to the support substrate 80. FIG. 5b shows two packages, each mounted to a separate flexible substrate 60 with package leads 52 electrically coupled to the flexible substrates 60. The two flexible substrates 60 are mounted together using a thin layer of adhesive 73 and each flexible substrate 60 has a portion 64 that connects to the support substrate 80.

Figure 6:
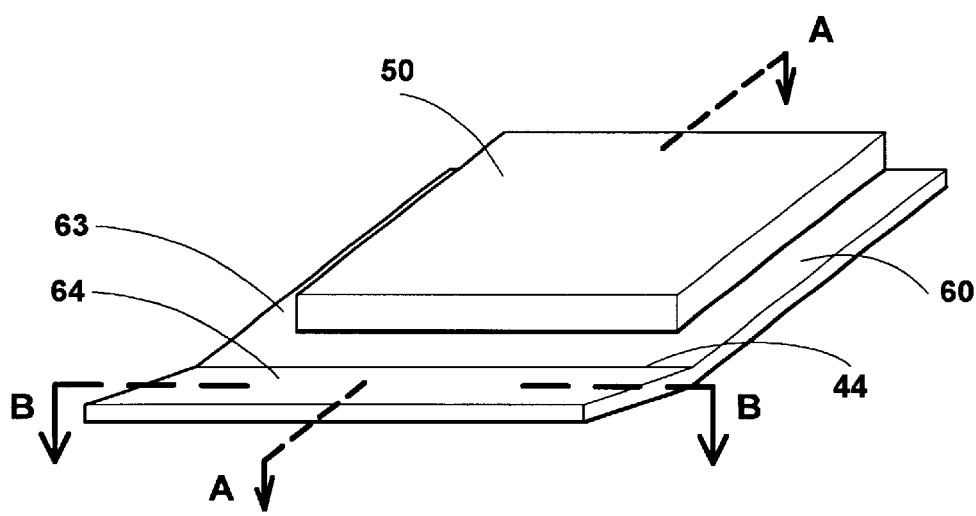
FIG. 6 is a three-dimensional view of a flexible substrate with one mounted package according to one aspect of the present invention.

FIG. 7 shows a cross-sectional view taken on line A—A of FIG. 6 of one aspect of the present invention. The internals of the package 50 are not illustrated in FIGS. 6–13 for simplicity. This embodiment utilizes a flexible substrate 60 comprised of one thin conductive signal layer 61 and a thin dielectric layer 62. Each signal layer 61 is typically comprised of a 1.4 mil layer of copper that is die cut to form package lead pads 68, interconnect pads 69 (FIGS. 1b, 3–5), and elongated traces 65. Interconnect pads 69 are electrically and thermal coupled to package lead mounting pads 68 through elongated thin strips of copper material 65 commonly referred to as either traces 65 or signal lines 65. A layer of solder resist (not illustrated) can be used to cover select portions of exposed conductive layers 61,67.

FIG. 8 shows a cross-sectional view taken on line B—B of FIG. 6 to illustrate a method for controlling the impedance of select signal traces 65a. This method utilizes traces 65b, formed in the signal layer 61, that are designated to be connected to electrical ground (GND). The characteristic impedance of a portion of a signal trace 65a is determined by methods well known in the arts by having one or more GND traces 65b in close proximity and parallel to the portion of the signal trace 65a. The distance and material between the signal trace 65a and the GND trace 65b are selected to obtain the desired characteristic impedance of the signal trace 65a which is preferably between 25 and 50 ohms.

Figure 9:
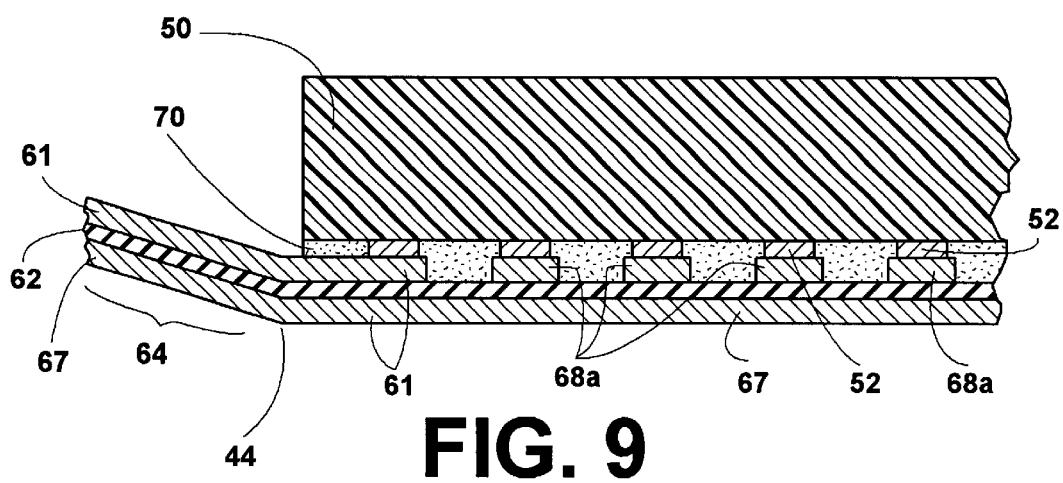
FIGS. 9–11 are different alternative cross-sections along line A—A of FIG. 6 for illustrating various alternative embodiments of the present invention.
Figure 10:
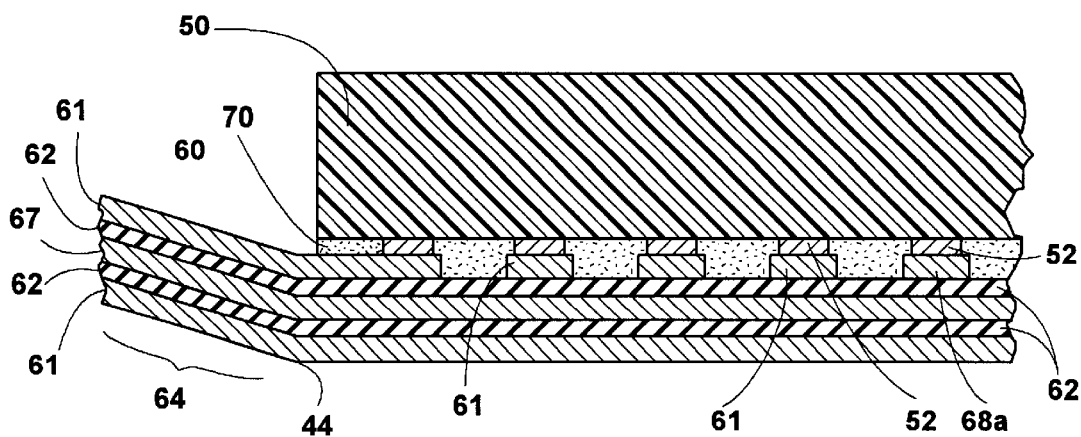

FIGS. 9 and 10 illustrate an alternative embodiment for controlling impedance of select signal traces 65a that can be used alone or in combination with other methods described herein. The flexible substrate 60 is formed with a ground (GND) plane layer 67 separated from the signal layer 61 by a thin high-dielectric layer 62 that is typically 1 mil to 11 mils thick. The thickness and material of the dielectric material 62 are selected to obtain the desired characteristic impedance of a signal trace 65 formed in the signal layer, which is preferably 25 to 50 ohms. Yet another alternative embodiment that provides for increased area for routing signals 65a is illustrated by FIG. 10. In this embodiment, a flexible substrate 60 is formed with two signal layers 61. Each signal layer 61 is separated from the ground layer 67 by a dielectric layer 62.

Figure 11:
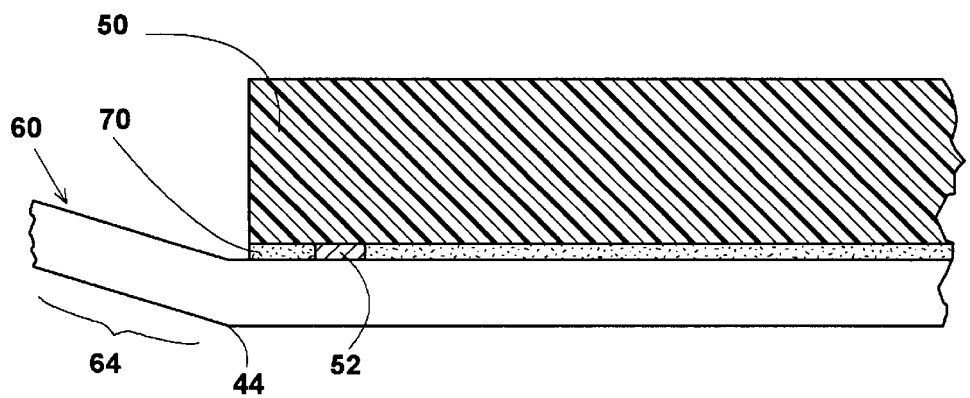

An embodiment of the present invention which minimizes the length of signal traces 65a and for maintaining consistent signal trace 65a length is illustrated by FIG. 11. This embodiment utilizes packages 50 that have package leads 52 located in close proximity to one of the sides of the package. The package is oriented on the first portion 63 of the flexible substrate 60 so that the leads 52 are close to the substrate mounting portion 64 of the flexible substrate 60.

FIG. 12a shows substrate mounting pads 69, which preferably are balls of solder similar to package leads 52. Preferably rigid spacers 40 formed of an electrically insulating and optionally thermally conductive material are positioned between the substrate pads to allow pressure to be applied to the substrate when heat is applied to prevent undesired electrical connections forming between adjacent pads 69. In this embodiment, pads 69 on the flexible substrate 60 are arranged such that select pads 69a, which are electrically coupled to signal traces 65a, are adjacent to one or more pads 69b, which are electrically coupled to the GND plane layer 67. This method provides impedance control as well shielding that decreases crosstalk.

Figure 13:
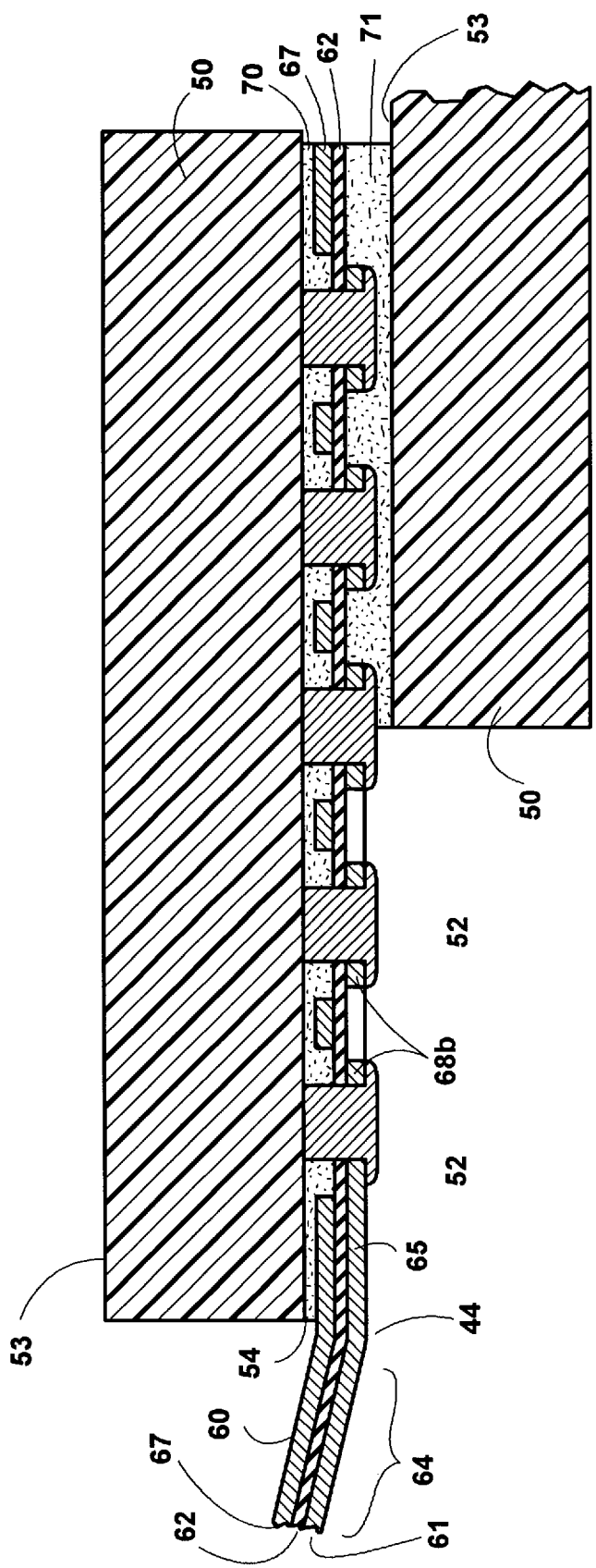
FIG. 13 is a another alternative cross-section along lines A—A of FIG. 6 for illustrating various aspects of the present invention. This illustration shows a flexible substrate flanked by the package shown in FIG. 6 and a second package.

FIGS. 12a and 13 illustrate a preferred embodiment of the present invention, which provides the advantages of being tolerant to variations in package lead length, eliminates vias on signal traces, and results in short traces. This embodiment may be used in conjunction with the methods described herein for precision impedance control. A flexible substrate 60 is formed with at least one copper layer 67 and at least one signal layer 61 separated by a thin dielectric layer 62. Apertures 66 extending through the flexible substrate 60 are each adapted to receive one package lead 52. Optionally, after the flexible substrate 60 is mounted to the bottom surface of a package 50, the distal end of all the package leads may be trimmed off. Pads 68b, shown in FIG. 12b, are formed in the signal layer 61 and surround a substantial portion of each aperture 66. Typically each pad 68b is ring-shaped, or partially-ring-shaped as shown in FIG. 12b, where the inner diameter of each ring-shaped pad 68b is defined by the perimeter edge of the aperture 66, and the ring-shaped pad 68b forms a partial flange around the aperture 66. The application of heat causes the solder on the package leads 52 to flow, electrically and thermally coupling the package leads 52 to the ring-shaped pads 68b, as shown in FIG. 13. Traces 65a formed in the signal layer electrically connect select ring-shaped pads 68b to select interconnect pads. The aperture 66 may be wider in the portion that extends through the GND plane layer 67 to electrically isolate package leads 52 from the GND plane layer 67. Solder resist coating (not illustrated) may be used to shield the exposed GND plane 67. Alternatively, electrically insulating adhesive 70 may be used to prevent solder from the leads 52 from electrically coupling to the GND plane 67.

One method for assembling a module includes the steps of: (1) depositing a thin layer of adhesive on the support substrate 80; (2) depositing a thin layer of adhesive 70 on the top surface of a first flexible substrate 60 leaving select areas void; (3) mounting a first set of one or more packages 50 to the flexible substrate 60 where apertures 66 formed in the flexible substrate 60 receive the package leads 52; (4) trimming off a portion of the distal end of all package leads 52; (5) applying heat to cause the solder on the package leads 52 to flow to electrically couple select package leads 52 to ring-shaped pads 68b surrounding each aperture 66; (6) depositing a thin layer of adhesive 72 on the top exposed surface of the wedge 90; (7) mounting the flexible substrate 60, with one or more mounted packages 50, to the support substrate 80 where a portion 64 of the flexible substrate 60 is adhered to pads on the support substrate 80 and a portion 63 of the flexible substrate, underlying the circuit packages, is adhered to the wedge 90; (8) repeating steps 3 through 6 for a second flexible substrate 60 and second set of one or more packages 50; (9) depositing a thin layer of adhesive 72 to the top surface 53 of the previously mounted packages 50; and (10) mounting the second flexible substrate 60, with one or more mounted packages 50, to the support substrate 80 where a portion 64 of the second flexible substrate 60 is adhered to the support substrate 80, and the portion 63 of the second flexible substrate 60 underlying the circuit packages 50 is adhered to a portion of the top surface 53 of each of the first set of one or more packages 50.

FIGS. 12c and 12d show alternate configurations for pads 68. FIG. 12 shows a preferred embodiment where the pad is formed on a flexible tab 68c that extends into an aperture 41 from within through the flexible substrate 60. As shown in FIG. 13, a double-sided adhesive film 70 is attached to the bottom surface 54 of the package 50. The adhesive film 70 is stamped to form apertures for package leads 52. Adhesive film 70 is electrically insulating and thermally conductive and has a thickness that is about the nominal length of a package lead 52. Pad 68c flexes with pressure, applied by the received package leads 52, insuring a firm connection while being tolerant to variations in package lead 52 length. In this embodiment, the flexible substrate 60 is oriented to the package with the conductive layer including pads 68c facing the bottom 54 of the package 50. An aperture 41 partially surrounds pads 68c for allowing flux, excess solder, and debris to be removed by vacuum suction. Each aperture 41 has a width that is constrained by the package lead 52 pitch and number of traces 65 routed between package leads. FIG. 12d shows an alternative configuration for pad 68 where the pad 68d extends across an aperture 41 that is provided for vacuum suction removal of flux, excess solder, and debris.

The foregoing disclosure and description of the invention are illustrative and explanatory of the preferred embodiments. Changes in the size, shape, materials and individual components used, elements, connections and construction may be made without departing from the spirit of the invention. The specification and drawings are, accordingly, presented by way of example only, and not limitation. Thus, the breath and scope of the invention should not be limited by the exemplary embodiments described herein, but should be defined only in accordance with the following claims and their equivalents.

I claim:

1. An integrated circuit module, comprising:
   a plurality of integrated circuit packages, each said package comprised of an integrated circuit die, a protective casing having two opposing planar surfaces, and a plurality of package leads extending from one of said planar surfaces;
   a support substrate having a substantially planar major surface;
   a flexible substrate, said flexible substrate having a first portion that is contiguous with a second portion, wherein;
      said second portion has a plurality of interconnects formed thereon that are adapted for electrical coupling to said support substrate;
      said first portion has a plurality of pads formed thereon that are adapted for electrical coupling to one of said package leads; and
      said flexible substrate has a plurality of elongated conductors each of which elongated conductors electrically couples a selected one of said interconnects to a selected one of said pads;
   wherein each said package is mounted to said first portion of said flexible substrate so as to provide for electrical coupling between said pads and said package leads, and wherein said second portions of each said flexible substrate extend away from said packages to adhere to said support substrate.

2. The module of claim 1, further comprising a plurality of said flexible substrates, each carrying a plurality of integrated packages.

3. The module of claim 2, wherein said plurality of said flexible substrates are arranged on said support substrate in overlapping fashion, and wherein said planar surfaces of each said package are inclined at an acute angle with respect to said major planar surface of said support substrate.

4. The integrated circuit module of claim 1, wherein said packages are mounted to said flexible substrate with a thin layer of thermally conductive adhesive.

5. The integrated circuit module of claim 1, wherein said flexible substrate includes an expanding portion to facilitate registration of the flexible substrate to said support substrate.

6. The integrated circuit module of claim 1, wherein said support substrate is formed with thin portion for receiving said flexible substrate to reduce the overall height of said module.

7. The integrated circuit module of claim 1, further comprising a wedge mounted to said support substrate for establishing the angle of inclination between said packages and said support substrate.

8. The integrated circuit module of claim 1, further comprising:

a plurality of electrically insulating spacers;

wherein said spacers are located between select said interconnects for electrically isolating each said select interconnect from other said interconnects.

9. The integrated circuit module of claim 1, wherein said second portion of said flexible substrate is folded to adhere to said support substrate.

10. The integrated circuit module of claim 1, wherein said geometry of a first and a second of said elongated conductors and the distance between said first and said second elongated conductors are selected to obtain a desired impedance in said first elongated conductor in range of 25 to 50 ohms.

11. The integrated circuit module of claim 1, wherein said flexible substrate is further comprised of a conductive ground plane, and a layer of electrically insulating material disposed between said ground plane and said elongated conductors.

12. The integrated circuit module of claim 1, wherein each said flexible substrate is further comprised of:

a first and a second thin dielectric layers of electrically insulating material;

a thin layer of conductive material; and wherein a first plurality of said elongated conductors are formed in a first signal layer and a second plurality of elongated conductors are formed in a second signal layer, wherein said first signal layer and said thin layer of conductive material flank said first thin dielectric layer and said a second signal layer and said thin layer of conductive material flank said second thin dielectric layer.

13. The integrated circuit module of claim 1, wherein each said flexible substrate is further comprised of, a plurality of apertures formed in each said flexible substrate that are each adapted to receive one of said package leads, wherein each said aperture extends through said flexible substrate;

wherein each said pad extends around a substantial portion of each said aperture.

14. The integrated circuit module of claim 1, wherein each said flexible substrate is further comprised of, a plurality of apertures extending through said flexible substrate, each said aperture is adapted to receive one of said package leads;

a plurality of flexible tabs, wherein each said tab extends into one said aperture and has one of said pads formed thereon.

15. An integrated circuit module, comprising:

a plurality of integrated circuit packages, each comprised of a integrated circuit die, a protective casing having a bottom planar surface, and a plurality of package leads extending from said bottom planar surface away from said package, wherein each said package lead is electrically coupled to said integrated circuit die and has a portion that extends through a layer of material comprising said casing;

a support substrate having a substantially planar major surface;

a plurality of thin flexible substrates, each said flexible substrate having a first portion that is contiguous with a second portion, wherein each said second portion has a plurality of interconnects formed thereon that are each adapted for electrical coupling to said support substrate, wherein each said first portion has a plurality of pads formed thereon that are each adapted for electrical coupling to one of said package leads, and wherein each said flexible substrate has a plurality of elongated conductors, wherein each said conductor is electrically coupled to one of said interconnects and one of said pads;

wherein a plurality of said packages are aligned side-by-side to form a row on said first planar portion of each said flexible substrate, and wherein select said pads couple to select said package leads of said mounted packages;

wherein said second portion of each said flexible substrate extends away from said mounted packages to adhere to said support substrate, wherein said packages are inclined at an acute angle with respect to said major planar surface of said support substrate; and wherein a first of said rows of said packages partially overlaps a second of said rows of said packages.

16. The integrated circuit module of claim 15:

wherein each elongated conductor is electrically coupled to both a first of said interconnects and a second of said interconnects; and wherein said support substrate is formed with a plurality of electrically conductive traces, each said trace electrically couples a select said interconnect on two of said flexible substrates, whereby one of said elongated conductors of each said flexible substrate are electrically connected in series to form one signal transmission line.

17. The integrated circuit module of claim 16:

wherein for each said flexible substrate, said first interconnects are located on said second portion in close proximity to a first end of said flexible substrate and said second interconnects are located on said second portion in close proximity to a second end of said flexible substrate, and wherein said second end is opposite to said first end;

wherein said two of said flexible substrates are adjacent and are orientated with the ends, which are in close proximity to said electrically coupled interconnects, located in close proximity to each other.

* * * * *